(12) United States Patent
Ohshima

(10) Patent No.: US 7,405,916 B2
(45) Date of Patent: Jul. 29, 2008

(54) CONTROL APPARATUS OF SEMICONDUCTOR SWITCH

(75) Inventor: Shunzou Ohshima, Toyota (JP)

(73) Assignee: Yazaki Corporation, Tokyo (JP)

( * ) Notice: Subject to any disclaimer, the term of this patent is extended or adjusted under 35 U.S.C. 154(b) by 42 days.

(21) Appl. No.: 11/174,582

(22) Filed: Jul. 6, 2005

(65) Prior Publication Data

US 2006/0007626 A1 Jan. 12, 2006

(30) Foreign Application Priority Data

Jul. 6, 2004 (JP) ............................. P2004-199202

(51) Int. Cl.
| | |
|---|---|
| H02H 3/20 | (2006.01) |
| H02H 9/04 | (2006.01) |
| H02H 3/027 | (2006.01) |
| H02K 29/00 | (2006.01) |
| H02K 21/00 | (2006.01) |
| H02K 23/00 | (2006.01) |
| H02K 31/00 | (2006.01) |
| H02P 1/00 | (2006.01) |
| H02P 3/00 | (2006.01) |
| H02P 5/00 | (2006.01) |
| H02P 7/00 | (2006.01) |
| H02P 1/18 | (2006.01) |
| H02P 3/08 | (2006.01) |
| H02P 7/06 | (2006.01) |
| H01R 39/46 | (2006.01) |

(52) U.S. Cl. ....................... 361/91.1; 318/138; 318/254; 318/439

(58) Field of Classification Search ........................ None
See application file for complete search history.

(56) References Cited

U.S. PATENT DOCUMENTS 5,144,209 A * 9/1992 Inaji et al. .................... 318/254
5,352,965 A * 10/1994 Kawabata ................... 318/807
5,446,352 A * 8/1995 Yang .......................... 318/248

(Continued)

FOREIGN PATENT DOCUMENTS

EP 0444484 A2 9/1991

(Continued)

OTHER PUBLICATIONS

Office Action dated Mar. 29, 2007, issued in German Patent Application No. 102005031622.0.

Primary Examiner—Stephen W Jackson
Assistant Examiner—Dharti H Patel
(74) Attorney, Agent, or Firm—Sughrue Mion, PLLC

(57) ABSTRACT

A control apparatus includes a plurality of load circuits, a power supply wiring line that connects the load circuits to a DC power supply in common, and a counter electromotive force detecting unit that detects counter electromotive force generated on the power supply wiring line. Each of the load circuits includes a load, a semiconductor switch configured to turn ON/OFF the load for protecting the corresponding load circuit, and a current detecting unit that detects an abnormal increase of a load current flowing through the corresponding load circuit. When the current detecting unit detects an abnormal increase of the load current and the counter electromotive force detecting unit detects that an occurrence of the counter electromotive force which exceeds a predetermined threshold value, the semiconductor switch corresponding to the load circuit is cut off.

9 Claims, 7 Drawing Sheets

| U.S. PATENT DOCUMENTS | | | | |
|---|---|---|---|---|
| 5,783,915 A | * | 7/1998 | Shida et al. | 318/135 |
| 6,555,988 B2 | * | 4/2003 | Masaki et al. | 318/721 |
| 7,030,582 B2 | * | 4/2006 | Masino | 318/439 |
| 2003/0141856 A1 | * | 7/2003 | Kimura | 323/282 |

FOREIGN PATENT DOCUMENTS

| EP | 1608065 A2 | 12/2005 |
|---|---|---|
| JP | 1-186113 A | 7/1989 |
| JP | 4-106769 U | 9/1992 |
| JP | 2000-253560 A | 9/2000 |
| JP | 2002-353794 A | 12/2002 |
| JP | 2004-48498 A | 2/2004 |
| WO | 02097940 A2 | 12/2002 |

* cited by examiner

CONTROL APPARATUS OF SEMICONDUCTOR SWITCH

BACKGROUND OF THE INVENTION

The present invention is related to a control circuit of a semiconductor switch provided between a DC power supply and a load, for protecting the semiconductor switch which turns ON/OFF the load from a shortcircuit current. More specifically, the present invention is directed to a technique capable of specifying a circuit where a shortcircuit/grounding event happens to occur and of cutting off this specified circuit in such a case that a plurality of loads and a plurality of semiconductor switches are provided with respect to the same DC power supply.

Loads (electric appliances) such as, for instance, a motor for driving a power window, or a lamp, which are mounted on a vehicle are driven by applying a DC voltage from a battery functioning as a DC power supply to the own loads. In this case, since a semiconductor switch such as a MOSFET and the like, which is provided between a load and the battery, is turned ON/OFF, this load is controlled to be driven/stopped.

Also, in a case that an overcurrent protecting apparatus is mounted on a vehicle, an overcurrent protecting apparatus immediately turns OFF the semiconductor switch for protecting both a circuit and a load when the overcurrent flows through the semiconductor switch. Such an overcurrent protecting apparatus is known from, for example, JP-A-2000-253560.

FIG. 6 is a circuit diagram for indicating an arrangement of the overcurrent protecting apparatus described in JP-A-2000-253560. As shown in FIG. 6, the overcurrent protecting apparatus has two sets of an N type MOSFET TA and an N type MOSFET TB as a semiconductor switch, which constitute a multi-source FET. Drains of the respective MOSFETs TA and TB are connected to a plus terminal of a DC power supply VB.

Also, a source of the MOSFET TA is connected via a load (RL) to a minus terminal (ground) of the DC power supply VB. On the other hand, a source of the MOSFET (TB) is grounded via a resistor Rr. A transition component resistor R10 is arranged parallel to the resistor Rr in order to properly accept a rush current. This rush current is produced during transition condition when a lamp is loaded.

Also, the overcurrent protecting apparatus has a comparator CMP10, and a latch DF100 provided on the side of an output of this comparator CMP10. The comparator CMP10 compares a source voltage VSA of the MOSFET TA with a source voltage VSB of the MOSFET TB in voltage levels. An output terminal of the latch DF100 is connected to one of input terminals of an AND circuit AND100.

Further, the overcurrent protecting apparatus has a switch SW100 and a resistor R102, which are employed so as to turn ON/OFF the MOSFETs TA and TB. One terminal side of the switch SW100 is connected to a power supply VB, and the other terminal side of the switch SW100, namely a junction point between the other terminal of the switch SW100 and the resistor R102 is connected to the other input terminal of the AND circuit AND100.

The output terminal of the AND circuit AND100 is connected to a driver circuit 100, and an output terminal of this driver circuit 100 is connected via a resistor R100 to a gate of the MOSFET TA and a gate of the MOSFET TB.

The transition component resistor R10 is connected to the circuit of the overcurrent protecting apparatus for a time period during which a rush current flows through a load RL, namely only for a predetermined time duration from a time instant when the switch SW100 was turned ON, and thereafter, is cut out from the circuit. The latch DF100 is reset when the switch SW100 is turned OFF, and an output signal of this latch DF100 becomes an H level.

Next, operations of the overcurrent protecting apparatus will now be explained. Since the two input signals of the AND circuit AND100 become H levels when the switch SW100 is turned ON, the output signal of the AND circuit AND 100 becomes an H level, and the driver circuit 100 supplies a charge pump voltage to the gate "G" (namely common gates of respective MOSFETs TA and TB) of the multi-source FET.

As a result, the respective MOSFETs TA and TB are brought into ON states, a load current "ID" flows through the MOSFET TA, and at the same time, a reference current "Iref" flows through the MOSFET TB.

In this case, the MOSFET TB is set to have the same characteristic as that of the MOSFET TA, and normally, a channel width of the MOSFET TB is set to $\frac{1}{1000}$ to $\frac{1}{2000}$ of a channel width of the MOSFET TA. As a consequence, assuming that (channel width of TA)/(channel width of TB)=n, "n" is nearly equal to 1000 to 2000. Then, assuming that the source voltages of the MOSFETs TA and TB are "VSA" and "VSB", when VSA=VSB, the load current ID is defined as ID=n*Iref.

The magnitude of the voltage VSA depends upon the resistance of the load resistor RL, whereas the magnitude of the voltage VSB depends upon either a resistor Rr, or a combined parallel resistance composed of the resistor Rr and the transition component resistor R10. Under such a condition that both the wiring line and the load are set to the normal conditions, both the resistor Rr and the transition component resistor R10 are set in such a manner that VSA>VSB while the rush current flowing time period is included. As a result, the output signal of the comparator CMP10 is held at an L level under normal condition.

At this time, when the wiring line connected between the MOSFET TA and the load RL is shortcircuited/grounded due to some reasons, the drain current ID of the MOSFET TA is rapidly increased, and thus, the source voltage VSA of the MOSFET TA becomes smaller than the source voltage VSB of the MOSFET TB, so that the output signal (L level) of the comparator CMP10 is changed into H level, and also, the output signal (H level) of the latch DF100 is switched to an L level. As a result, the output signal of the AND circuit AND100 becomes an L level, the output terminal side of the driver circuit 100 is grounded, and also, the gate G of the multi-source FET is grounded via the resistor R100, so that the MOSFETs TA and TB are turned OFF. As a consequence, the shortcircuit current flowing through the MOSFET TA is cut out, so that both the wiring line and the MOSFET TA can be protected.

FIG. 7 is a characteristic diagram for representing a change of the current ID in such a case that when a rush current does not flow, namely the load RL is set under the normal condition, the wiring line between the MOSFET TA and the load RL is shortcircuited to be grounded.

As shown in FIG. 7, when the load current ID under the normal condition flows through the circuit of the overcurrent detecting apparatus, if a shortcircuit/grounding event happens to occur at a time instant constituting a point A1, the current ID rapidly starts to be increased. Assuming that a resistance of the wiring line through which the current ID flows is equal to "Rw", an inductance of this wiring line is "Lw", a drain-to-source resistance of the MOSFET TA is "RonA", the power supply voltage is "VB", and an internal resistance of the power supply is "Rbatt", the current ID flowing when the shortcircuit happens to occur is increased based upon an exponential function curve of a time constant "τ1" which is expressed by the below-mentioned equation (2), while a current value "ID1" indicated by the below-mentioned equation (1) is defined as a target value.

$$ID1=VB/(RonA+Rw+Rbatt) \quad (1)$$

$$\tau1=Lw/(RonA+Rw+Rbatt) \quad (2)$$

Then, when the present time exceeds such a time instant constituting a point A2, the current ID becomes ID≧n*Iref, so that the multi-source FET is cut off. In this case, the gate G of the multi-source FET is grounded via the resistor R100, so that electric charges are discharged which is stored in the gate G. In this case, if a gate capacitance of this gate G is assumed as "Cg", then a discharge time constant becomes Cg*R100.

Since the gate-to-source voltage VGSA of the MOSFET TA is reached to approximately 10 V before being cut off, a finite time is required until the discharging operation of the gate electrons are accomplished. When the gate-to-source voltage VGSA is lowered due to the gate discharge operation, the drain-to-source resistance RonA of the MOSFET TA is increased.

In other words, although the resistance RonA is constant until the time instant of the point A2, this resistance RonA is increased when the time instant A2 elapses, so that the current ID1 shown in the above-described equation (1) becomes small, and the same time, the time constant "τ1" is also decreased. As a result, the current ID is increased in a linear manner which is deviated from the expositional function, and then, is reached to a peak current at a time instant constituting a point A3. The faster the gate electrons of the multi-source FET are discharged, namely, the smaller the resistor R100 is decreased, the faster the time instant is reached to the point A3, so that the peak value of the current ID becomes low. Since the increase of the resistor RonA is continued, when the time instant of the point A3 has elapsed, the current ID is decreased and becomes zero at a time instant constituting a point A4.

FIG. 8 is a characteristic diagram for representing a change of the current ID in such a case that a shortcircuit/grounding event (failure) happens to occur during a transition period just after the switch SW1 is turned ON, namely while the transition component resistor R10 is being connected parallel to the resistor Rr. In this drawing, a curved line indicated by a two-dot and dash line represents a change of the current ID under such a normal condition that a shortcircuit/grounding event does not occur. In this drawing, the current ID corresponds to a so-called "rush current", and this rush current may be reached to such a peak current value which becomes larger than the current ID under normal condition by 5 to 10 times.

Then, in order to avoid such an erroneous judgement that this rush current is recognized as a shortcircuit current, a shortcircuit current judging value (n*Iref) is set to such a value which is larger than the peak value of the rush current. In other words, in FIG. 8, a dashed line for indicating (n*Iref) is set to become larger than the peak value of the rush current indicated by the two-dot dash line. In this case, in order to set the reference current Iref to a large value, the transition component resistor R10 is additionally connected parallel to the resistor Rr for a predetermined time (namely, rush current flowing time period).

When a shortcircuit/grounding event happens to occur at a point B1 of FIG. 8, the current ID is rapidly increased, the multi-source FET is cut off at a point B2, and the current ID is increased up to a point B3, and thereafter, the current ID is decreased. The operations are resembled to the above-described operation case of FIG. 7. The point B1 to B4 of FIG. 8 correspond to the points A1 to A4 of FIG. 7.

A different point between FIG. 7 and FIG. 8 is the magnitude of the current Iref. In FIG. 8, since the shortcircuit current judging value (n*Iref) is set to such a value which exceeds the rush current, when the multi-source FET is cut off, namely the current ID at the point B2 is increased, the peak value (point B3) of the shortcircuit current is increased. Until the point B2 where the MOSFET TA is turned ON, the source-to-drain voltage becomes a small value, so that even when a large current flows, a power loss of this MOSFET TA is small.

Then, when the present time passes through the point B2, the MOSFET TA is turned OFF, so that the source-to-drain voltage thereof is increased. If a large current flows under this condition, then a power loss of the MOSFET TA is increased. In FIG. 7, since the peak value of the shortcircuit current at the point A3 is small, the power loss is relatively small. In the case of FIG. 8, since the current ID is increased after the present time has passed through the point B2, the power loss of the MOSFET TA becomes large value, which may cause a temperature of the channel of this MOSFET TA to be increased. Since a time period from the point B1 to the point B4 during which the shortcircuit current flows corresponds to such a short time period shorter than, or equal to 300 [μsec], the increase in the channel temperature of the MOSFET TA may be restricted by a transition thermal resistance.

Since the transition thermal resistance of this time range is determined by a chip size, an element having a large chip size must be used in order to suppress an increase of a channel temperature caused by a shortcircuit current. In other words, such an element having a small chip size cannot be used, so that a design freedom is restricted, which may cause a cost-up factor.

Also, there is another problem in fluctuations of the reference current Iref. That is, in order to avoid that the MOSFET TA is erroneously cut off by the rush current, the following measures must be taken, namely, the precision of the rush current judging value is increased, or an interval between the peak value of the rush current and the judging value is sufficiently widened. Any of these solving methods may cause the cost-up factor. As another solving method, one method has been proposed in which an overheat interrupting function capable of detecting an overheat condition of a semiconductor element to interrupt a current is additionally provided so as to protect an FET. Similarly, this solving method may cause the cost-up factor.

Furthermore, in the case that plural sets of loads such as electric appliances have been provided, circuits which constitute a total channel number in correspondence with a total number of loads must be employed. As a result, there is such a problem that the construction of the apparatus becomes bulky.

As previously explained, in the related overcurrent protecting apparatus, the discrimination of the shortcircuit current under the normal condition from the shortcircuit current under the abnormal condition is carried out by detecting the difference in the levels of the currents which flow through the MOSFET. As a result, when the peak value of the rush current is increased, the time required to be reached to the judging value is prolonged, so that the judgement as to the occurrence of the shortcircuit is delayed, and therefore, the timing when the shortcircuit current is cut off is delayed. As a consequence, the power loss of the semiconductor element is increased, so that such a problem may occur. That is, the temperature increase of the semiconductor element is enlarged.

Furthermore, the technique disclosed in JP-A-2000-253560 does not describe operations executed in the case that there are a plurality of FET channels which are connected to the DC power supply.

SUMMARY OF THE INVENTION

The present invention has been made to solve the above-described problems of the related art, and therefore, has an object to provide a control apparatus of a semiconductor switch, capable of increasing discrimination precision between a shortcircuit current and a rush current, and at the same time, capable of shortening a judging time for detecting an occurrence of a shortcircuit current as short as possible. Thus, this control apparatus can quickly cut off a circuit when the shortcircuit current is produced, and thus, can minimize a power loss and a temperature increase of a semiconductor element.

Also, another object of the present invention is to provide a control apparatus of a semiconductor switch, by which in such a case that plural sets of load circuits equipped with semiconductor switches and loads have been connected with respect to the same DC power supply, when a shortcircuit/grounding event happens to occur in any of these load circuits, this shortcircuited load circuit is specified, and only such a load circuit where the shortcircuit/grounding event happens to occur can be cut off.

In order to achieve the above objects, according to the present invention, there is provided a control apparatus of a semiconductor switch, comprising:
 a plurality of load circuits;
 a power supply wiring line that connects the load circuits to a DC power supply in common; and
 a counter electromotive force detecting unit that detects counter electromotive force generated on the power supply wiring line,
  wherein each of the load circuits including:
  a load;
  a semiconductor switch configured to turn ON/OFF the load for protecting the corresponding load circuit; and
  a current detecting unit that detects an abnormal increase of a load current flowing through the corresponding load circuit; and
 wherein when the current detecting unit detects an abnormal increase of the load current and the counter electromotive force detecting unit detects that an occurrence of the counter electromotive force which exceeds a predetermined threshold value, the semiconductor switch corresponding to the load circuit is cut off.

According to the present invention, there is also provided a control apparatus, comprising:
 a plurality of load circuits;
 a power supply wiring line that connects the load circuits to a DC power supply in common; and
 a counter electromotive force detecting unit that detects counter electromotive force generated on the power supply wiring line,
  wherein each of the load circuits including:
  a load;
  a semiconductor switch configured to turn ON/OFF the load for protecting the corresponding load circuit;
  a voltage detecting unit that detects a voltage across both terminals of the semiconductor switch; and
  a controller that controls to cut off the semiconductor switch; and
 wherein when the voltage detecting unit detects that the voltage across both the terminals of the semiconductor switch becomes greater than or equal to a predetermined level and the counter electromotive force detecting unit detects that the counter electromotive force greater than or equal to a predetermined threshold value is generated on the power supply wiring line, the controller cuts off the semiconductor switch.

Preferably, the voltage detecting unit includes a series circuit constituted by a first resistor and a second resistor connected in series to each other and an amplifier for adjusting a current which flows through the series circuit so that the voltage across both the terminals of the semiconductor switch becomes equal to a voltage produced in the first resistor. The voltage detecting unit produces a voltage across the second resistor, the voltage being obtained by amplifying the voltage across both the terminals of the semiconductor switch based on a ratio of a resistance value of the first resistor to a resistance value of the second resistor, and determines whether the voltage across both the terminals of the semiconductor switch becomes greater than or equal to a predetermined level by comparing the amplified voltage with a predetermined voltage having a predetermined level.

Preferably, the counter electromotive force detecting unit includes a series circuit constituted by a capacitor and a reference voltage producing resistor which are connected in series to each other, the series circuit provided between the ground and one terminal of the power supply wiring line on the side of the semiconductor switch. A voltage produced at a junction point between the capacitor and the reference voltage producing resistor is defined as a reference voltage. The counter electromotive force detecting unit determines that a shortcircuit/grounding event is occurred in at least one of the load circuits when a difference voltage between a voltage produced across one terminal of the power supply wiring line and the reference voltage exceeds a predetermined threshold voltage.

Preferably, the counter electromotive force detecting unit includes a timer for outputting a counter electromotive force generating signal when the difference voltage exceeds the predetermined threshold voltage. The timer continues the output of the counter electromotive force generating signal for a predetermined time, the counter electromotive force generating signal indicating that the difference voltage exceeds the predetermined threshold voltage.

Preferably, the controller includes a switch that connects a gate of the semiconductor switch to the ground when the voltage detecting unit detects that the voltage across both the terminals of the semiconductor switch becomes greater than or equal to the predetermined level and the counter electromotive force detecting unit-determines that an occurrence of the counter electromotive force greater than or equal to the predetermined threshold value.

Preferably, the semiconductor switch is a MOSFET (Metal-Oxide-Semiconductor Field-Effect Transistor); and
 wherein the voltage across both the terminals of the semiconductor switch is a source-to-drain voltage of the MOSFET.

Preferably, the DC power supply is a battery mounted on a vehicle. The load is an electric appliance mounted on the vehicle.

Preferably, In the control apparatus of the semiconductor switch according to the present invention, among a plurality of load circuits which are branched from a single power supply wiring line and are connected to this power supply wiring line, when a shortcircuit/grounding event happens to occur in any of these plural load circuits, the occurrence of this shortcircuit/grounding event can be firmly detected, so that only such a load circuit where the shortcircuit/grounding event happens to occur can be cut off.

That is to say, in the case that the shortcircuit/grounding event happens to occur in any one of these plural load circuits, since counter electromotive force generated on the power supply line is detected by the counter electromotive force detecting unit, the occurrence of the shortcircuit/grounding event can be first of all detected. In addition, since abnormal increases of load currents which flow through the respective load circuits are detected, such a load circuit that the shortcircuit/grounding event happens to occur can be specified. Then, only this specified load circuit can be cut off, so that both the semiconductor switch and the circuit can be firmly protected from the shortcircuit current, and also, other load circuits where the shortcircuit/grounding event does not occur can be directly driven in the continuous manner.

Also, since the occurrence of the shortcircuit/grounding event is detected under such a condition that the magnitude of the counter electromotive force generated on the power supply wiring line exceeds a predetermined threshold value, it is possible to avoid such a problem that the circuit is erroneously cut off due to the rush current which is produced when the power supply is turned ON.

As a consequence, while the high-speed cutting off operation may be carried out, the protection apparatus capable of protecting the semiconductor switch in higher reliability can be realized.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
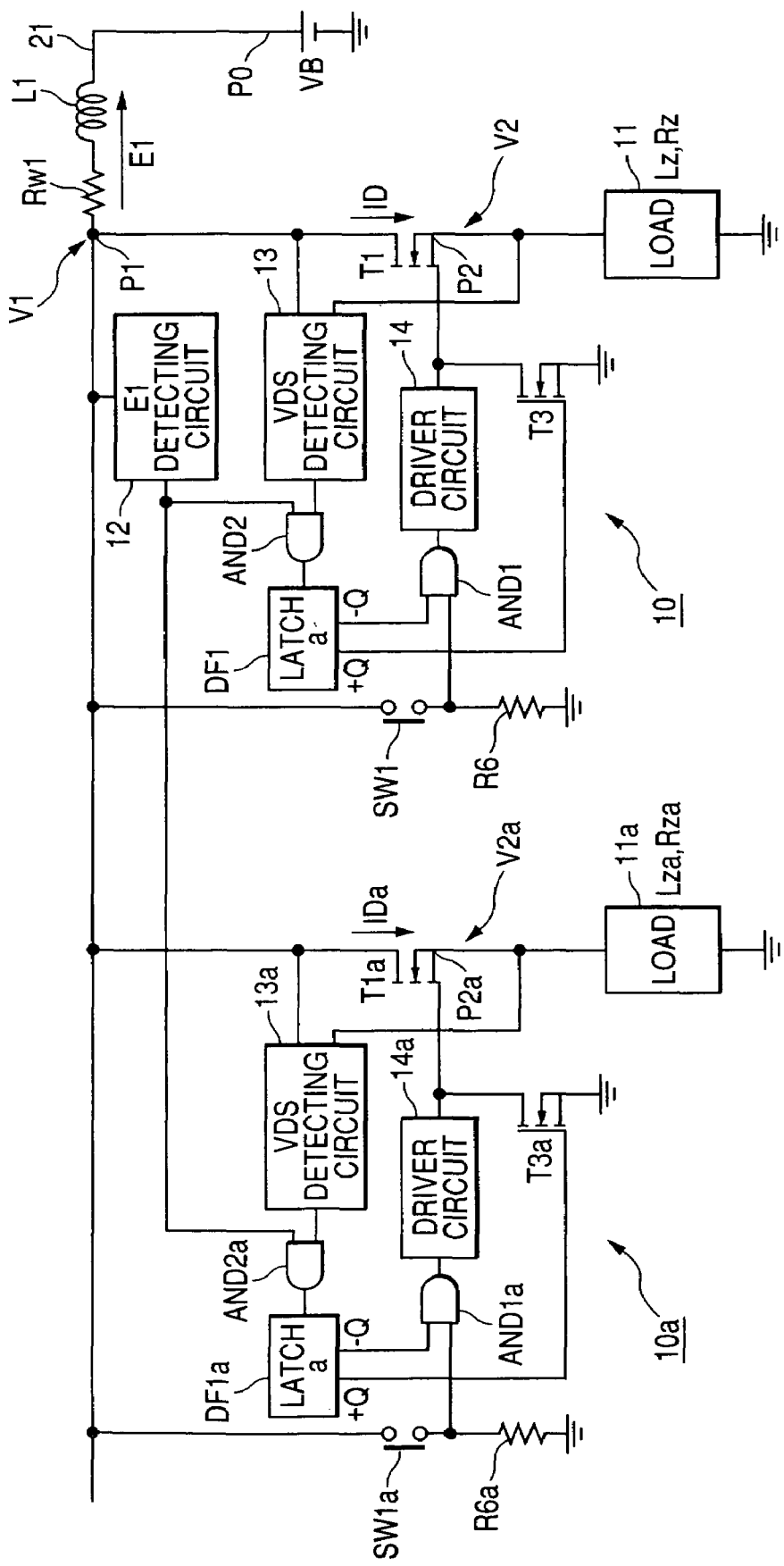
FIG. 1 is a circuit diagram for indicating an arrangement of a control apparatus of a semiconductor switch according to an embodiment of the present invention.

Referring now to drawings, various embodiments of the present invention will be described. FIG. 1 is a circuit diagram for indicating an arrangement of a control apparatus of a semiconductor switch, according to an embodiment of the present invention. As shown in FIG. 1, this control apparatus includes a DC power supply VB, and a plurality of load circuits, namely a first load circuit 10 and a second load circuit 10a. The DC power supply VB corresponds to, for example, a battery mounted on a vehicle. Driving power is supplied from the DC power supply VB to the first load circuit 10 and the second load circuit 10a so as to drive the first and second load circuits 10 and 10a. It should also be noted that although this embodiment represents such a case that two sets of the load circuits 10 and 10a are contained as one example, three, or more sets of load circuits may be alternatively provided.

Figure 2:
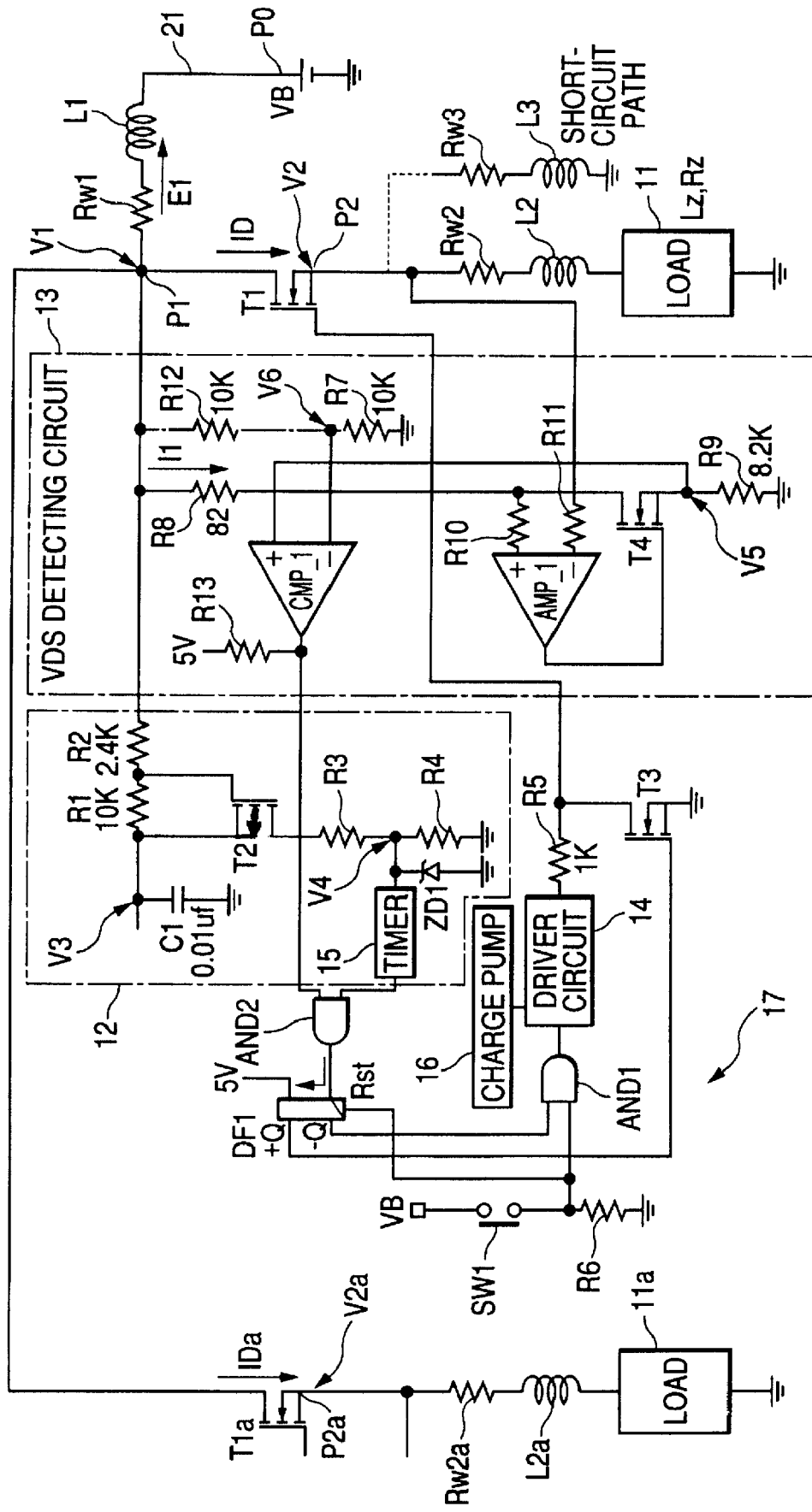
FIG. 2 is a circuit diagram for showing a detailed arrangement as to both a VDS detecting circuit and a counter electromotive force detecting circuit provided in the control apparatus of the semiconductor switch shown in FIG. 1.

The first load circuit 10 includes a load 11, and a MOSFET T1. The load 11 corresponds to either a motor or a lamp, and the like, which are mounted on a vehicle. The MOSFET T1 corresponds to a semiconductor switch which is interposed between the load 11 and the DC power supply VB, and operates to drive/stop the load 11. Also, as indicated in FIG. 2 (will be explained later), a wiring line connected between the MOSFET T1 and the load 11 has both a resistance Rw2 and an inductance L2.

Then, a drain of the MOSFET T1 shown in FIG. 1 is connected to a point P1, and further, this point P1 is connected to a plus-sided terminal of the DC power supply VB via a power supply line 21 having an resistance Rw1 and an inductance L1. Similarly, a drain of an MOSFET T1a included in the second load circuit 10a is connected to the point P1. In other words, the wiring line (namely, power supply line 21) between the point P1 and the DC power supply VB is commonly provided with respect to the respective load circuits 10 and 10a.

A counter electromotive force detecting circuit 12 is connected to the point P1 to detect counter electromotive force "E1" which is generated on the power supply wiring line 21.

Both the source and the drain of the MOSFET T1 which are employed so as to switch a driving operation and a stopping operation of the load 11 are connected to a VDS detecting circuit 13, namely both the point P1 and the point P2 are connected to the VDS detecting circuit 13, respectively. Thus, both an output signal of this VDS detecting circuit 13 and an output signal of the counter electromotive force detecting circuit 12 are supplied to two input terminals of an AND circuit AND2 of a control unit 17, respectively.

When a magnitude of the counter electromotive force E1 generated on the power supply wiring line 21 exceeds a predetermined threshold voltage, the counter electromotive force detecting circuit 12 outputs a signal having an H level, whereas when a drain-to-source voltage VDS of the MOSFET T1 exceeds a predetermined voltage, the VDS detecting circuit 13 outputs a signal having an H level. As a result, in the case that these conditions can be satisfied, a signal level of an output signal from the AND circuit AND2 becomes an H level.

The output terminal of the AND circuit AND2 is connected to a latch DF1, an output "+Q" of this latch DF1 is connected to a gate of a MOSFET T3 (namely, grounding-purpose switch means), and another output "−Q" of this latch DF1 is connected to one input terminal of the AND circuit AND 1. Also, the other input terminal of the AND circuit AND1 is connected to a junction point between a switch SW1 and a resistor R6, and the other terminal of the switch SW1 is connected to the point P1, and the other terminal of the resistor R6 is connected to the ground.

Furthermore, the output terminal of the AND circuit AND1 is connected to a driver circuit 14, and an output terminal of the driver circuit 14 is connected to both the gate of the MOSFET T1 and a drain of the MOSFET T3. Also, a source of the MOSFET T3 is connected to the ground.

The latch DF1 is reset when the switch SW1 is set under OFF state, and thus, two sorts of signals "−Q" and "+Q" are output from this latch DF1. The "−Q" output corresponds to such a signal having an H level when the latch DF1 is reset, and is input to one input terminal of the AND circuit AND1. Also, the "+Q" output corresponds to such a signal having an L level when the latch DF1 is reset, and is input to the gate of the MOSFET T3.

The second load circuit 10a shown in FIG. 1 owns the same structure of the first load circuit 10, and the circuit of this second load circuit 10a is identical to that of the first load circuit 10 except that the counter electromotive force detecting circuit 12 is commonly employed. Accordingly, a suffix "a" is given to the respective structural elements, and explanations of these structural elements will be omitted.

FIG. 2 is an explanatory diagram for indicating a detailed circuit arrangement as to the VDS detecting circuit 13 and the counter electromotive force detecting circuit 12, which are provided in the first load circuit 10. As indicated in this drawing, the VDS detecting circuit 13 has a series circuit constituted by series-connecting resistors R12 and R7 to each other, and another series circuit constituted by series-connecting a resistor R8 (first resistor) and a resistor R9 (second resistor) to each other. These series circuits are provided between the point P1 and the ground.

Also, the VDS detecting circuit 13 has a comparator CMP1. A minus-sided input terminal of the comparator CMP1 is connected to a junction point between the resistor R12 and the resistor R7, whereas a plus-sided input terminal of the comparator CMP1 is connected to another junction point between the resistor R9 and a MOSFET T4. Then, an output terminal of the comparator CMP1 is connected via a resistor R13 to the power supply +5 V, and further, is connected to another input terminal of an AND circuit AND2.

Further, a MOSFET T4 is provided between the resistor R8 and the resistor R9, and a gate of this MOSFET T4 is connected to an output terminal of an amplifier AMP1. A plus-sided input terminal of the amplifier AMP1 is connected via a resistor R10 to a drain of the MOSFET T4, and a minus-sided input terminal of the amplifier AMP1 is connected via a resistor R11 to a source (P2) of the MOSFET T1. It should be noted that the resistance value of the resistor R11 is made equal to the resistance value of the resistance R10.

The counter electromotive force detecting circuit 12 has contained a series circuit constituted by series-connecting a resistor R2, a resistor R1 (reference voltage producing resistor), and a capacitor C1 to each other. One terminal of the resistor R2 is connected to the point P1 and one terminal of the capacitor C1 is connected to the ground.

Also, the counter electromotive force detecting circuit 12 has a MOSFET T2, the source of which is connected to a junction point between the resistor R1 and the capacitor C1, and the gate of which is connected to a junction point between the resistor R1 and the resistor R2. A drain of the MOSFET T2 is connected to the ground via a series circuit made by series-connecting the resistors R3 and R4 to each other, and a junction point between the resistors R3 and R4 is connected to a timer 15. Then, an output terminal of the timer 15 is connected to the input terminal of the AND circuit AND2. Also, a zener diode ZD1 is arranged in a parallel manner with respect to the resistor R4.

In addition, although not shown in FIG. 1, a resistor R5 is arranged between the driver circuit 14 and the gate of the MOSFET T1, and a charge pump 16 for supplying electric power to the driver circuit 14 is attached to the driver circuit 14.

Next, a description is made of operations as to the control apparatus of the semiconductor switch, which is arranged in the above-described manner according to this embodiment. When an operator turns ON the switch SW1, since the signal having the H level is supplied to one input terminal of the AND circuit AND1 and the signal having the H level is applied from the latch DF1 to the other input terminal thereof, the output signal of the AND circuit AND1 becomes an H level. As a result, the driver circuit 14 is initiated, and thus, a drive signal is output from the driver circuit 14 to the gate of the MOSFET T1.

Accordingly, the MOSFET T1 is turned ON, so that the power supply voltage supplied from the DC power supply VB is applied to the load 11 via the wiring line constructed of the resistance Rw2 and the inductance L2 so as to drive the load 11. At this stage, the drain voltage of the MOSFET T1, namely a voltage "V1" at the point P1 has become equal to the voltage of the power supply VB, and furthermore, a voltage "V3" (will also be referred to as "reference voltage" hereinafter) at the junction point between the capacitor C1 and the resistor R1 of the counter electromotive force detecting circuit 12 has become substantially equal to the above-explained voltage "V1."

Also, the VDS detecting circuit 13 controls a current "I1" which flows through the resistors R8 and R9 in such a manner that the source-to-drain voltage VDS of the MOSFET T1 may become equal to such a voltage across both terminals of the resistor R8. In other words, the VDS detecting circuit 13 performs the below-mentioned control operation in order that VDS=I1*R8 can be satisfied. That is to say, in a case that the voltage across both the terminals of the resistor R8 is lower than the source-to-drain voltage VDS, since the output signal of the amplifier AMP1 is increased, the current I1 is increased so as to increase the above-described voltage across both the terminals of the resistor R8. To the contrary, in a case that the voltage across both the terminals of the resistor R8 is higher than the source-to-drain voltage VDS, since the output signal of the amplifier AMP1 is decreased, the current I1 is decreased so as to lower the above-described voltage across both the terminals of the resistor R8.

As a consequence, a voltage V5 at the junction point between the source of the MOSFET T4 and the resistor R9 may be expressed by the following equation (3), assuming that an ON resistance of the MOSFET T1 is defined as "Ron."

$$\begin{aligned}V5 &= R9*I1 \\ &= R9*VDS/R8 \\ &= R9*Ron*ID/R8 \\ &= R9*(Ron/R8)*ID\end{aligned} \quad (3)$$

That is, when it may be regarded that the voltage V5 is in direct proportion to the voltage VDS and the ON resistance Ron is constant, the load current ID is also in direct proportion to this voltage V5. As a result, an increase of the load current ID may appear in the form of an increase of the voltage VDS and an increase of the voltage V5. The voltage at the junction point between R12 and R7 is designated as V6 and the resistance values of the ON resistance Ron, the resistor R8 and R9 are selected in such a manner that V5 is nearly equal to a half of V6 under the normal circuit state. In this case, if the drain current ID increases to be two times larger than the current value under the normal circuit condition, the voltage V5 becomes larger than V6 so that the level of the output signal of the comparator CMP1 into which both the voltage V5 and the voltage V6 are input is inverted from the L level to the H level.

It should also be understood that as one example of detecting of the increase of the load current ID, when the load current ID becomes two times larger than the current value under the normal condition, the signal level of the output signal of the comparator CMP1 is inverted. However, the present invention is not limited only to the above-explained two times.

Next, a description is made of operations of the counter electromotive force detecting circuit 12 in such a case that a shortcircuit to be grounding event happens to occur. In the case that the wiring line between the load 11 and the MOSFET T1 is shortcircuited/grounded due to a certain reason, since the source of the MOSFET T1 is connected to the ground via a shortcircuit path having a resistance Rw3 and an inductance L3, an excessively large shortcircuit current ID may instantaneously flow.

Since this shortcircuit current ID is produced, counter electromotive force E1 is generated from the point P1 toward the point P0 (namely, on the side of power supply VB) on the power supply wiring line 21. As a result, the voltage V1 of the point P1 is rapidly lowered. In contrast to this voltage decrease, since the reference voltage V3 is lowered in accordance with such a time constant which is set by the capacitor C1, and the resistors R1 and R2, this reference voltage V3 cannot follow the rapid decrease of the voltage V1. As a consequence, a potential difference may be produced between the voltage V1 and the reference voltage V3.

Then, if this potential difference becomes large and the voltage across both the terminals of the resistor R1 exceeds a predetermined level, then the MOSFET T2 is turned ON, and the voltage V4 at the junction point between the resistors R3 and R4 is increased, so that the timer 15 is turned ON. As a consequence, the timer 15 continuously outputs the H-leveled signal for a predetermined time (for example, 0.1 [msec]). This H-leveled signal is supplied to one input terminal of the AND circuit AND2. It should also be noted that the timer 15 is employed due to the following reason. That is, even when the voltage V4 is increased only for a very short time, this timer 15 catches this increase and outputs the H-leveled signal to the latch DF1 for a predetermined time period.

In this case, the resistance values of the resistors R1 and R2 have been set in such a manner that the MOSFET T2 is turned ON by counter electromotive force generated when a shortcircuit/grounding event happens to occur, whereas this MOSFET T2 is not turned ON by counter electromotive force which is generated by a normal transient current (rush current), while the rush current is produced when the MOSFET T1 is turned ON.

Also, as previously explained, if the shortcircuit/grounding event occurs, so that the load current ID is increased, then the signal level of the output signal from the comparator CMP1 is inverted from the L level to the H level in the VDS detecting circuit 13. As a consequence, both the signals having the H levels are supplied to the two input terminals of the AND circuit AND2, so that the signal level of the output signal from this AND circuit AND2 becomes the H level.

As a result, since the −Q output of the latch DF1 becomes an L level, the driver circuit 14 is stopped. Moreover, since the +Q output of the latch DF1 becomes an H level, the MOSFET T3 is turned ON, so that the gate of the MOSFET T1 is connected to the ground. As a consequence, the MOSFET T1 is turned OFF, so that the load circuit 10 can be protected from the shortcircuit current.

Also, in the load circuit 10a, although the detection signal of the counter electromotive force is output from the counter electromotive force detecting circuit 12 (refer to FIG. 1), since an H-leveled signal is not output from the comparator CMP1 of the VDS detecting circuit 13a, the output signal of the AND circuit AND2a does not become an H level, and thus, the MOSFET T1a is not cut off. In other words, among the plural load circuits 10 and 10a, only such a load circuit is cut off, in which the shortcircuit/grounding event happens to occur, and other load circuit may be operated under the normal condition.

Figure 3:
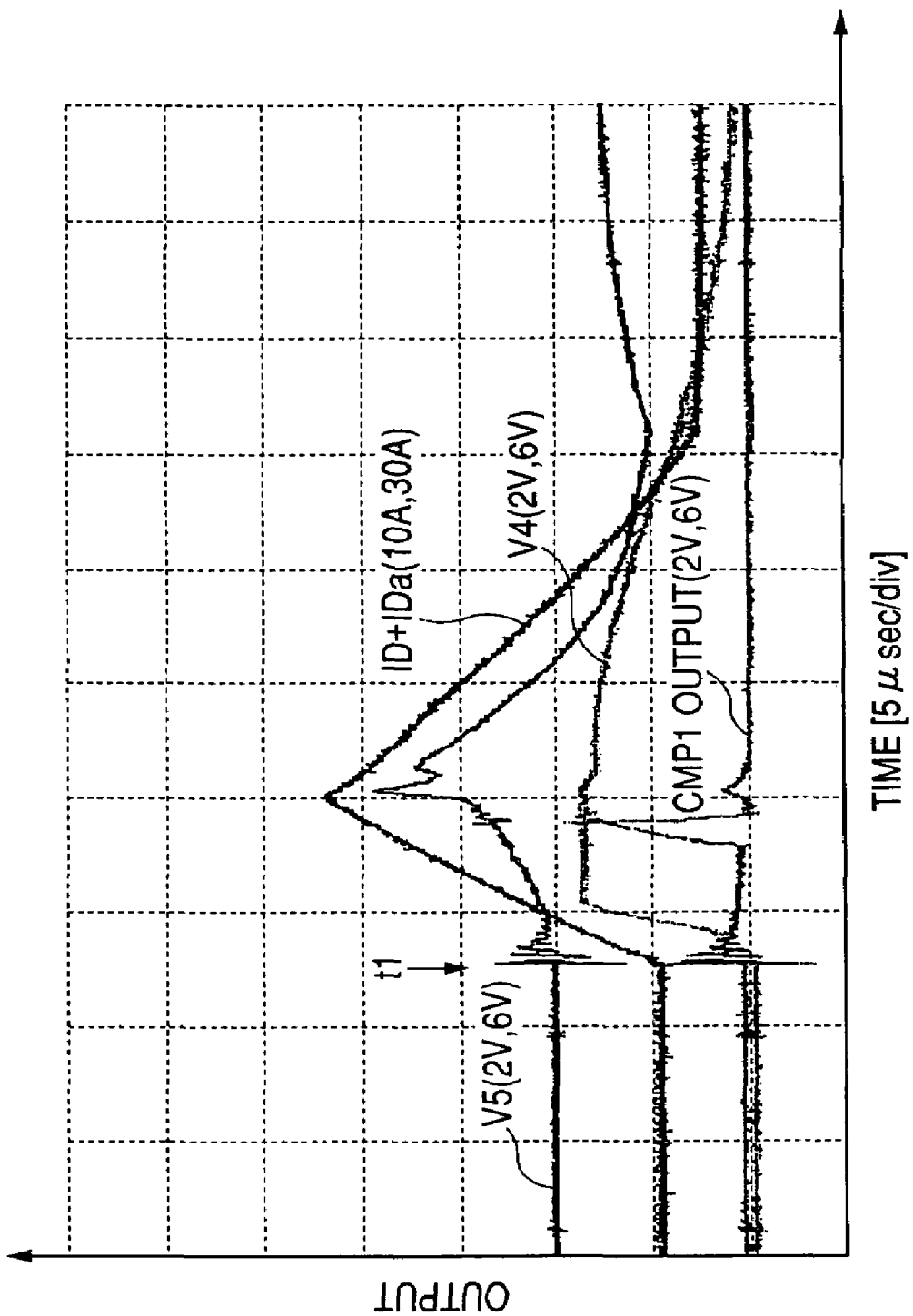
FIG. 3 is a characteristic diagram for indicating changes as to a current ID+IDa, a voltage V4, an output voltage of a CMP1, and a voltage V5 when a shortcircuit/grounding event happens to occur.
Figure 4:
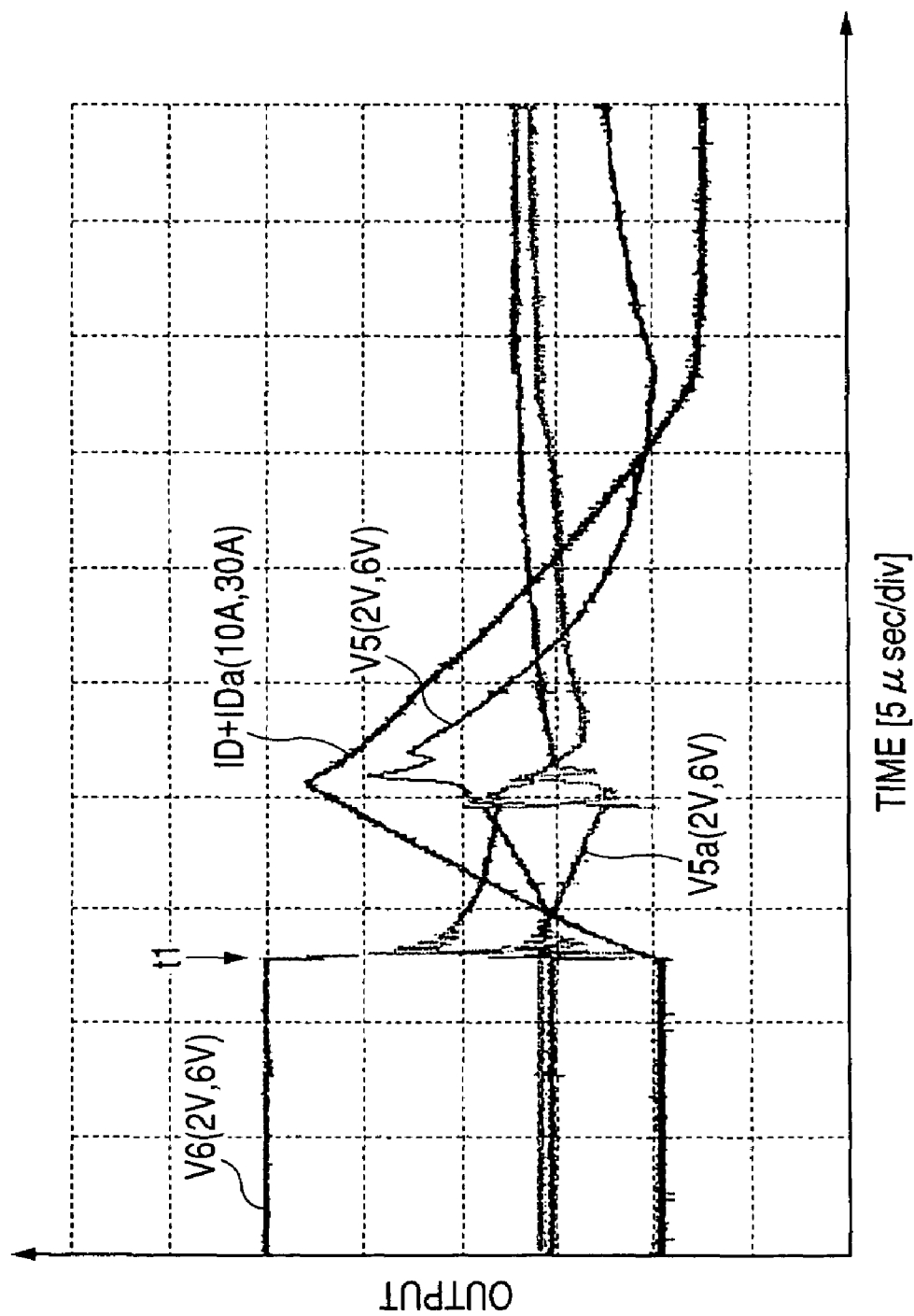
FIG. 4 is a characteristic diagram for indicating changes as to a current ID+IDa, and voltages V5, V5a, and V6 when a shortcircuit/grounding event happens to occur.
Figure 5:
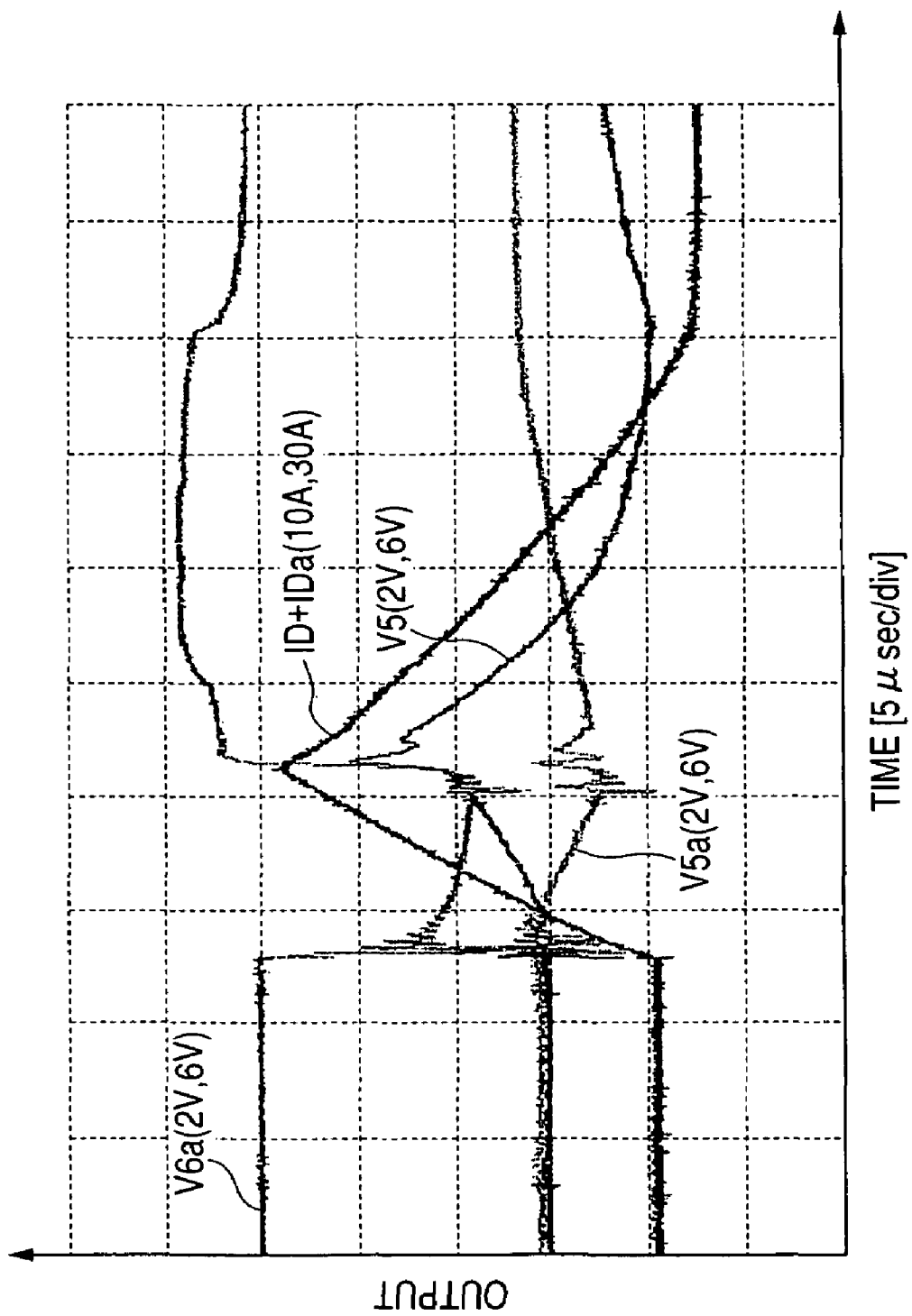
FIG. 5 is a characteristic diagram for indicating changes as to a current ID+IDa, and voltages V5, V5a, and V6a when a shortcircuit/grounding event happens to occur.
Figure 6:
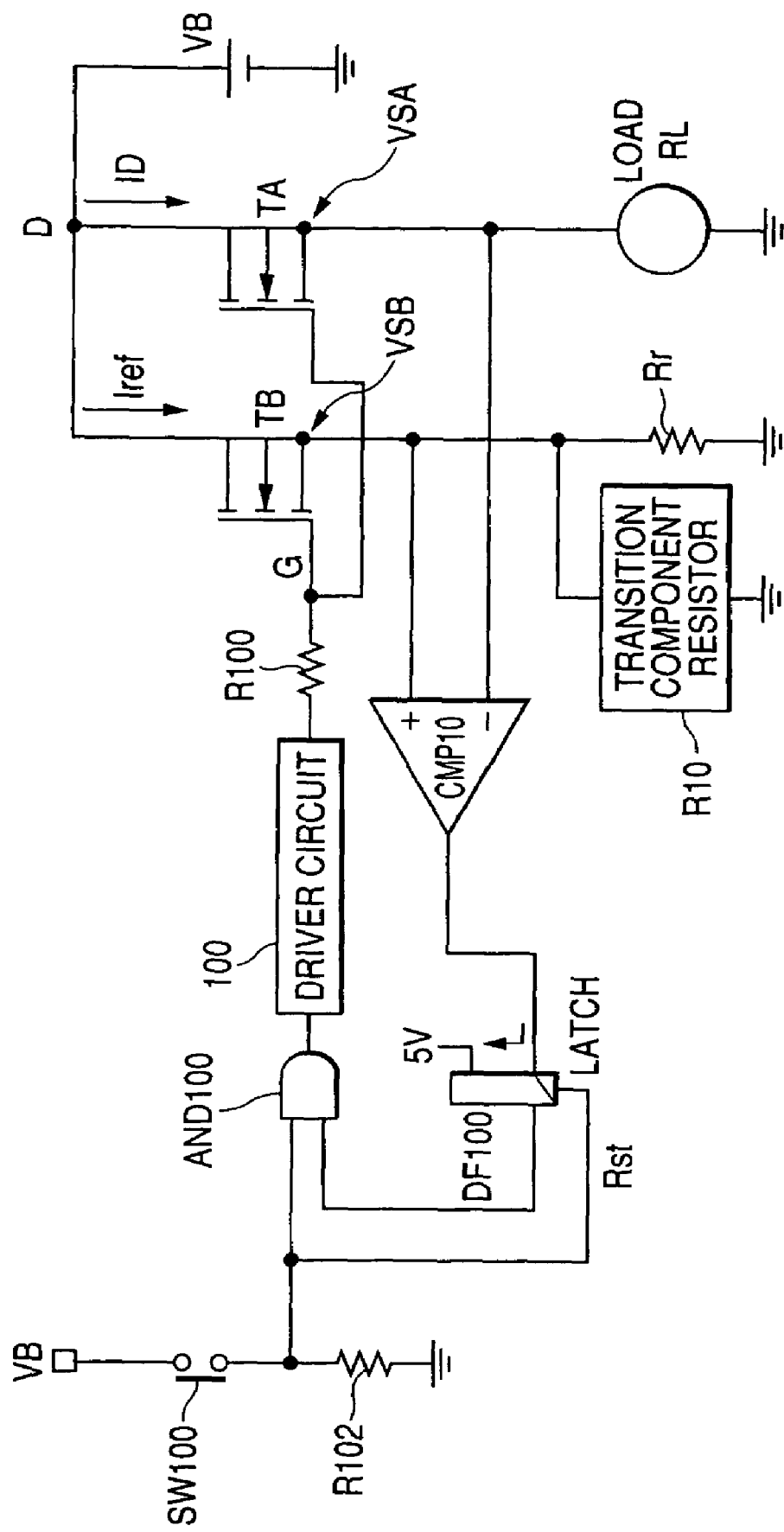
FIG. 6 is a circuit diagram for showing the arrangement as to the conventional control apparatus for the semiconductor switch.
Figure 7:
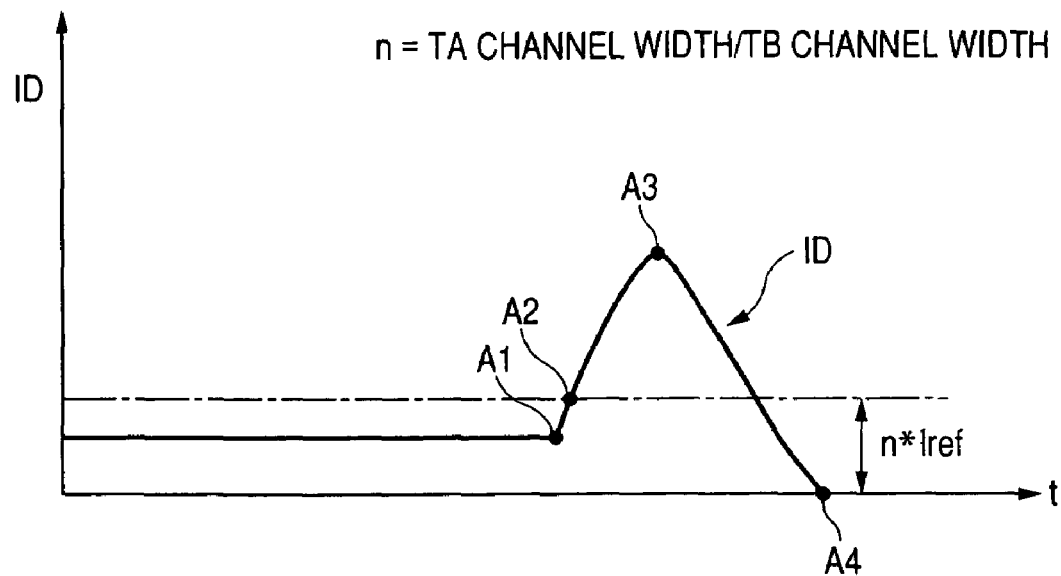
FIG. 7 is a characteristic diagram for representing the changes in the load currents ID when the shortcircuit current flows through the circuit shown in FIG. 6.
Figure 8:
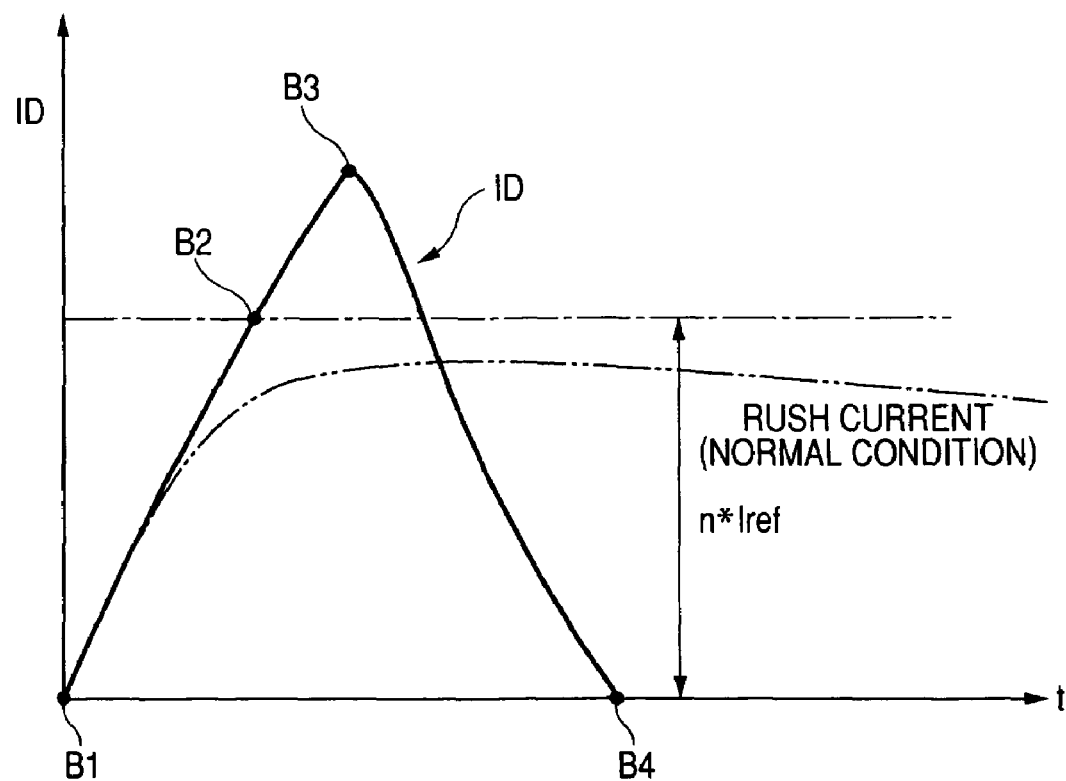
FIG. 8 is a characteristic diagram for representing the changes in the load currents ID when the shortcircuit current flows through the circuit shown in FIG. 6 during the transition time period.

Next, changes as to actual current values and actual voltage values will now be explained with reference to FIG. 3 to FIG. 5. FIG. 3 to FIG. 5 represent waveforms obtained when the control apparatus of the semiconductor switch is operated under the below-mentioned condition and respective circuit constants shown in FIG. 2.

That is, as to the power supply wiring line 21 (namely, wiring line from point P0 to point P1), a cross-sectional area thereof is 3 sq (symbol "sq" indicates mm2), and a length thereof is 1 meter. As to the shortcircuit line (namely, line from point P2 to ground), a cross-sectional area thereof is 3 sq, and a length thereof is 1 meter. The MOSFET T1 corresponds to an N type MOSFET, and an ON resistance thereof is 7.3 [mΩ]. A threshold voltage of the MOSFET T2 is 1.9 [V]. The loads 11 and 11a commonly correspond to 3 sets of lamps having wattage ratting of 21 [W], respectively.

Further, as to the circuit constants shown in FIG. 2, the resistor R12 has 10 [KΩ]; the resistor R7 has 10 [KΩ]; the resistor R8 has 82 [Ω]; the resistor R9 has 8.2 [KΩ]; the resistor R1 has 10 [KΩ]; the resistor R2 has 2.4 [KΩ]; the resistor R5 has 1 [KΩ]; and a capacitance of the capacitor C1 is 0.01 [μF].

Under such a condition that the MOSFET T1 and the MOSFET T1a drive the loads 11 and 11a (constructed of 3 lamps with 21 W) respectively, such a current defined by ID+IDa=9.5 A flows through the power supply wiring line 21.

FIG. 3 represents a relationship among a current "ID+IDa" after a shortcircuit/grounding event happens to occur (1 section of ordinate corresponds to 10A, and center horizontal line along ordinate direction indicates 30A); an output voltage "V4" of the counter electromotive force power detecting circuit 12 (1 section of ordinate corresponds to 2 V, and center horizontal line along ordinate direction indicates 6 V); an output voltage of the comparator CMP1 (1 section of ordinate corresponds to 2 V, and center horizontal line along ordinate direction indicates 6 V); and a voltage "V5" produced across the resistor R9 (1 section of ordinate corresponds to 2 V, and center horizontal line along ordinate direction indicates 6 V). It should also be noted that 1 section of the abscissa corresponds to 5 μsec.

As shown in FIG. 3, when a shortcircuit/grounding event happens to occur at a time instant t1, the voltage V4 rises after a time period of 2 μsec has elapsed, and the output of the comparator CMP1 rises after a time period of 6 μsec has elapsed from the time instant t1. As a result, since the signal level of the output of the AND circuit AND2 becomes an H level, the MOSFET T1 is cut off, and the current "ID+IDa" becomes a peak current at a time after a time period of 7 μsec has elapsed from the time instant t1. Thereafter, this current "ID+IDa" is decreased, and then, the current "ID" becomes zero at a time instant after a time period of 15 μsec has elapsed. On the other hand, since the turn-ON operation of the MOSFET T1a provided on the side of the load circuit 10a is continued, the current IDa=4.8 A continuously flows even after a time period of 15 μsec has elapsed.

FIG. 4 shows a relationship among an amplified voltage V5, a judging voltage V6, and another amplified voltage V5a. The voltage V5 is obtained by amplifying the source-to-drain voltage VDS of the MOSFET T1. The voltage V5a is obtained by amplifying the source-to-drain voltage VDSa of the MOS- FET T1a. It should also be noted that 1 section of an ordinate of each of the voltages corresponds to 2 V, and 1 section of an abscissa corresponds to 5 μsec.

If a shortcircuit/grounding event happens to occur at a time instant "t1", then counter electromotive force E1 is instantaneously generated in the power supply wiring line 21, so that the voltages V1 and V2 are rapidly lowered, and the judging voltage V6 is rapidly lowered. On the other hand, although the current ID starts to rise at a sharp gradient, since the current I1 flowing the resistor R9 is not instantaneously increased, the voltage VDS is not essentially increased just after the shortcircuit/grounding event happens to occur. As a result, the voltage V5 is not lowered. The voltage V5a may behave in a similar manner. Lowering of the voltage V1 is absorbed by the source-to-drain voltage of the MOSFET T4 to be reduced.

Thereafter, since the voltage V1 is lowered in connection with the increase of the current ID, the voltage V6 is slightly decreased. On the other hand, the voltage V5 is increased in response to the increase of the voltage VDS, and then, this voltage V5 becomes higher than the voltage V6 (namely, V5>V6) at a time instant when a time period of 6 μsec has elapsed from the time instant t1. At this time instant, the signal level of the output signal of the comparator CMP1 is inverted to an H level, so that the MOSFET T1 is cut off.

FIG. 5 is a characteristic diagram for indicating a relationship between the voltage V6a and the voltage V5a of the MOSFET T1a of the load circuit 10a. It should be understood that in this drawing, a left-sided value within a parentheses indicates 1 scale of an ordinate, and a right-sided value within the parentheses shows a value of a center horizontal line of the ordinate, which are similar to those of FIG. 3 and FIG. 4.

As indicated in FIG. 5, the voltage V6a behaves in a similar trend to that of the voltage V6 until the MOSFET T1 is cut off. After the MOSFET T1 is cut off, since the voltage V1 is increased, the voltage V2a is raised up, so that the voltage V6a is increased so as to maintain this voltage V6a at an approximately 12V.

On the other hand, the voltage V5a is decreased while the current ID is increased whereas the voltage V5a is increased while the current ID is decreased. As a result, although the shortcircuit/grounding event happens to occur on the side of the load circuit 10, in the load circuit 10a in which the wiring line between the MOSFET T1a and the load 11a is under the normal condition, the voltage relationship of V6a>V5a are maintained and the ON state is continued.

As previously described, in the control apparatus of the semiconductor switch according to this embodiment, the plural sets of the load circuits 10 and 10a are connected with respect to the same DC power supply VB. In such a case that the shortcircuit/grounding event happens to occur in any one of these plural load circuits 10 and 10a, the magnitude of the counter electromotive force is detected, which is generated on the power supply wiring line 21 which is commonly employed in the respective load circuits 10 and 10a. Further, the magnitudes of the currents flowing through the respective load circuits 10 and 10a are detected, and thus, only such a MOSFET which is owned by the above-described load circuit where the shortcircuit/grounding event happens to occur is cut off.

As a consequence, when a shortcircuit/grounding event happens to occur, at a stage before a temperature of a relevant MOSFET becomes abnormal, this MOSFET can be cut off. As a result, the MOSFET, the load, and the wiring line can be firmly protected from the overcurrent.

Also, as to the other load circuit in which the shortcircuit/grounding event does not occur, while the relevant MOSFET is not cut off, this load circuit is operated in the normal mode.

As a result, it is possible to avoid such a problem that the entire circuit is cut off due to an occurrence of a shortcircuit/grounding event in a single load circuit.

Furthermore, in the counter electromotive force detecting circuit 12, although the occurrence of the shortcircuit/grounding event is detected when the magnitude of the counter electromotive force E1 generated on the power supply wiring line 21 exceeds the predetermined level, since the predetermined level is set to such a value larger than the magnitude of the counter electromotive force generated by the rush current, the counter electromotive force E1 generated by the rush current during the transition time period when the switch SW is turned ON does not exceed the predetermined level, so that the MOSFET T2 is not turned ON.

Also, in the case that the occurrence of the shortcircuit/grounding event is detected, the gate of the MOSFET T1 is forcibly grounded in such a way that the operation of the driver circuit 14 is stopped, and also, the MOSFET T3 provided between the gate of the MOSFET T1 and the ground is turned ON. As a result, the MOSFET T1 can be instantaneously turned OFF, and the damage given to the circuit can be reduced as small as possible.

Also, while a current sensor, or the like is not provided in each of the load circuits, the occurrence of the shortcircuit/grounding event can be detected, so that a total number of the structural components can be reduced, and cost-down can be realized.

While the control apparatus of the semiconductor switch of the present invention is described with reference to the embodiments shown in the drawings, the present invention is not limited thereto. That is, the arrangements of the respective units of this control apparatus may be alternatively replaced by arbitrarily selected arrangements having similar functions.

For instance, in the above-described embodiment, the following example is exemplified. That is, the MOSFETs are explained as the semiconductor switches, but the present invention is not limited thereto. Alternatively, other semiconductor switches such as a junction transistor and an IGBT (Insulated Gate Bipolar Transistor) may be employed.

Also, in the above-described embodiment, the following example is exemplified. That is, while the DC power supply is realized by the battery mounted on the vehicle, the load is realized by the lamp, the motor, or the like, which are mounted on the vehicle. However, the present invention is not limited only to this exemplified example, but may be applied to other power supplies and other loads.

Furthermore, another arrangement may be alternatively employed in which an increase of a load current is detected by such a current sensor which is well known in this technical field and is assembled to the MOSFET T1.

As to such a circuit having an arrangement in which a plurality of load circuits are connected with respective a single DC power supply, the control apparatus of the semiconductor switch may be considerably useful for protecting the circuit from a shortcircuit/grounding event.

The present application is based on Japan Patent Application No. 2004-199202 filed on Jul. 6, 2004, the contents of which are incorporated herein for reference.

What is claimed is:

1. A control apparatus, comprising:
a plurality of load circuits;
a power supply wiring line that connects the load circuits to a DC power supply in common; and
a counter electromotive force detecting unit that detects counter electromotive force generated on the power supply wiring line,
wherein each of the load circuits including:

a load;
a semiconductor switch configured to turn ON/OFF the load for protecting the corresponding load circuit; and
a current detecting unit that detects an abnormal increase of a load current flowing through the corresponding load circuit; and
wherein when the current detecting unit detects the abnormal increase of the load current and the counter electromotive force detecting unit detects that an occurrence of the counter electromotive force which exceeds a predetermined threshold value, the semiconductor switch corresponding to the load circuit is cut off.

2. A control apparatus, comprising:
a plurality of load circuits;
a power supply wiring line that connects the load circuits to a DC power supply in common; and
a counter electromotive force detecting unit that detects counter electromotive force generated on the power supply wiring line,
wherein each of the load circuits including:
a load;
a semiconductor switch configured to turn ON/OFF the load for protecting the corresponding load circuit;
a voltage detecting unit that detects a voltage across both terminals of the semiconductor switch; and
a controller that controls to cut off the semiconductor switch; and
wherein when the voltage detecting unit detects that the voltage across both the terminals of the semiconductor switch becomes greater than or equal to a predetermined level and the counter electromotive force detecting unit detects that the counter electromotive force greater than or equal to a predetermined threshold value is generated on the power supply wiring line, the controller cuts off the semiconductor switch.

3. The control apparatus as set forth in claim 2, wherein the voltage detecting unit includes a series circuit constituted by a first resistor and a second resistor connected in series to each other and an amplifier for adjusting a current which flows through the series circuit so that the voltage across both the terminals of the semiconductor switch becomes equal to a voltage produced in the first resistor; and
wherein the voltage detecting unit produces a voltage across the second resistor, the voltage being obtained by amplifying the voltage across both the terminals of the semiconductor switch based on a ratio of a resistance value of the first resistor to a resistance value of the second resistor, and determines whether the voltage across both the terminals of the semiconductor switch becomes greater than or equal to a predetermined level by comparing the amplified voltage with a predetermined voltage having a predetermined level.

4. The control apparatus as set forth in claim 1, wherein the counter electromotive force detecting unit includes a series circuit constituted by a capacitor and a reference voltage producing resistor which are connected in series to each other, the series circuit provided between the ground and one terminal of the power supply wiring line on the side of the semiconductor switch;
wherein a voltage produced at a junction point between the capacitor and the reference voltage producing resistor is defined as a reference voltage; and
wherein the counter electromotive force detecting unit determines that a shortcircuit/grounding event is occurred in at least one of the load circuits when a difference voltage between a voltage produced across one terminal of the power supply wiring line on the side of the semiconductor switch and the reference voltage exceeds a predetermined threshold voltage.

5. The control apparatus as set forth in claim 2, wherein the counter electromotive force detecting unit includes a series circuit constituted by a capacitor and a reference voltage producing resistor which are connected in series to each other, the series circuit provided between the ground and one terminal of the power supply wiring line on the side of the semiconductor switch;
wherein a voltage produced at a junction point between the capacitor and the reference voltage producing resistor is defined as a reference voltage; and
wherein the counter electromotive force detecting unit determines that a shortcircuit/grounding event is occurred in at least one of the load circuits when a difference voltage between a voltage produced across one terminal of the power supply wiring line and the reference voltage exceeds a predetermined threshold voltage.

6. The control apparatus as set forth in claim 5, wherein the counter electromotive force detecting unit includes a timer for outputting a counter electromotive force generating signal when the difference voltage exceeds the predetermined threshold voltage; and
wherein the timer continues the output of the counter electromotive force generating signal for a predetermined time, the counter electromotive force generating signal indicating that the difference voltage exceeds the predetermined threshold voltage.

7. The control apparatus as set forth in claim 2, wherein the controller includes a switch that connects a gate of the semiconductor switch to the ground when the voltage detecting unit detects that the voltage across both the terminals of the semiconductor switch becomes greater than or equal to the predetermined level and the counter electromotive force detecting unit determines that an occurrence of the counter electromotive force greater than or equal to the predetermined threshold value.

8. The control apparatus as set forth in claim 2, wherein the semiconductor switch is a MOSFET (Metal-Oxide-Semiconductor Field-Effect Transistor); and
wherein the voltage across both the terminals of the semiconductor switch is a source-to-drain voltage of the MOSFET.

9. The control apparatus as set forth in claim 2, wherein the DC power supply is a battery mounted on a vehicle; and
wherein the load is an electric appliance mounted on the vehicle.

* * * * *